(12) United States Patent
Konishi et al.

(10) Patent No.: US 6,819,580 B2
(45) Date of Patent: Nov. 16, 2004

(54) SEMICONDUCTOR CHIP SELECTIVELY PROVIDING A PREDETERMINED POTENTIAL TO A DEAD PIN

(75) Inventors: Masayuki Konishi, Tokyo (JP); Takehiko Shimomura, Tokyo (JP)

(73) Assignee: Renesas Technology Corp., Tokyo (JP)

(*) Notice: Subject to any disclaimer, the term of this patent is extended or adjusted under 35 U.S.C. 154(b) by 72 days.

(21) Appl. No.: 10/356,537

(22) Filed: Feb. 3, 2003

(65) Prior Publication Data

US 2004/0027847 A1 Feb. 12, 2004

(30) Foreign Application Priority Data

Aug. 7, 2002 (JP) ......................................... 2002-229418

(51) Int. Cl.[7] ................................................. G11C 5/06
(52) U.S. Cl. ....................... 365/63; 365/51; 365/189.03; 365/195; 365/226
(58) Field of Search ............................ 365/63, 72, 51, 365/189.03, 195, 191, 226

(56) References Cited

U.S. PATENT DOCUMENTS 5,455,788 A * 10/1995 Clark ......................... 365/156
5,535,163 A * 7/1996 Matsui ........................ 365/201

FOREIGN PATENT DOCUMENTS

| JP | 63-191400 | * | 8/1988 | ........... G11C/29/00 |
| JP | 5-217383 |   | 8/1993 | ......... G11C/11/417 |

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A semiconductor chip is provided, with which presence of dead pins can be easily noticed and a process for controlling the potential at dead pins can be performed easily. An input/output controller (IOC) for coordinating the input/output of signals through individual pins (PN1 to PN8) includes an input/output buffer (BFa) and the input/output buffer (BFa) includes a switch (SW4a) and a switch (SW4b). A setting memory (STMa) for storing settings for control of the input/output of signals in the input/output buffer (BFa) contains a memory table and the memory table contains an item about the dead pin potential control process so that a power-supply potential (Vdd) or a ground potential (GND) can be applied to the dead pins, i.e. the fourth pin (PN4) and the fifth pin (PN4).

6 Claims, 10 Drawing Sheets

SEMICONDUCTOR CHIP SELECTIVELY PROVIDING A PREDETERMINED POTENTIAL TO A DEAD PIN

BACKGROUND OF THE INVENTION

1. Field of the Invention

The present invention relates to a semiconductor chip that has a plurality of pins serving as signal input/output terminals.

2. Description of the Background Art

FIG. 9 is a diagram showing the structure of a common semiconductor chip that includes logic circuitry, memory circuitry, etc. This semiconductor chip CP includes core circuitry CR that provides logical and memory functions for processing and storing signals and an input/output controller IOC for coordinating the input/output of the signals. The semiconductor chip CP is also provided with a large number of pins PN located along its periphery and serving as signal input/output terminals.

The input/output controller IOC includes an input/output buffer BF and a setting memory STM. The input/output buffer BF times and coordinates the transfer of signals between the core circuitry CR and the pins PN, i.e. an input signal Din to the core circuitry CR and an output signal Dout from the core circuitry CR. The setting memory STM, formed of a register, is a storage area for storing settings for the control of input/output signals by the input/output buffer BF.

Now, when a semiconductor chip is encapsulated, e.g. with resin, and packaged, all pins on the semiconductor chip may or may not be connected to external lead terminals of the package.

FIG. 10 is a diagram that shows a simple example of the packaging of a semiconductor chip, where a semiconductor chip CPa has eight pins that are all connected to the external lead terminals of the package. On the other hand, FIG. 11 shows an example in which some of the pins of the same semiconductor chip CPa are not connected to external lead terminals of the package.

In FIG. 10, pins PN1 to PN8 on the semiconductor chip CPa are respectively connected to external lead terminals LD1 to LD8 of the package PKa through bonding wires WB1 to WB8.

On the other hand, in FIG. 11, the pins PN1 to PN3 and PN6 to PN8 on the semiconductor chip CPa are respectively connected to the external lead terminals LD1 to LD3 and LD6 to LD8 of the package PKb through bonding wires WB1 to WB3 and WB6 to WB8, but the package PKb does not have bonding wires and external lead terminals for the fourth pin PN4 and the fifth pin PN5. That is to say, the fourth pin PN4 and the fifth pin PN5 are dead (unconnected) pins that are not used.

In general, a semiconductor chip CPa often has such dead pins, depending on its use. For example, when specifications drawn up by one customer need the fourth and fifth pins PN4 and PN5 but specifications by another customer do not need the fourth and fifth pins PN4 and PN5, it is a common practice to deliver the same semiconductor chips CPa enclosed in the package PKa of FIG. 10 and the package PKb of FIG. 11 respectively to the two customers. The package PKb of FIG. 1, which has no unnecessary external lead terminals, can be smaller in size than the package PKa of FIG. 10.

Now, the input/output buffer BF sets the directions of signals at individual pins on the basis of the contents stored in the setting memory STM, so as to determine whether the individual pins on the semiconductor chip serve as input pins for receiving input signals from the outside or as output pins for extracting output signals to the outside. The input/output buffer BF has a mechanism, for each pin, to set the signal direction.

FIG. 12 is a diagram showing an example of the signal direction setting mechanism in a conventional input/output buffer BFe, where, among the pins PN1 to PN8 on the semiconductor chip CPa, the fourth pin PN4 and the fifth pin PN 5 are shown with their respective mechanisms.

For example, the signal direction setting mechanism for the fourth pin PN4 includes a 3-state buffer TB4 and a transfer gate TG4.

The 3-state buffer TB4 receives an output signal Dout from the core circuitry CR at its input end, and its output end is connected to the fourth pin PN4. Also, information stored in the setting memory STMe is given as a signal SG4c, e.g. logically inverted, to the enable end of the 3-state buffer TB4.

The input end of the transfer gate TG4 is connected to the fourth pin PN4 and its output end outputs an input signal Din to the core circuitry CR. The signal SG4c is given to the gate of the N-channel MOS transistor of the transfer gate TG4, and also to the gate of the P-channel MOS transistor of the transfer gate TG4 through an inverter IV4.

The signal SG4c is applied to both of the 3-state buffer TB4 and the transfer gate TG4 as shown above, and then it can be determined whether to make the fourth pin PN4 function as an input pin or an output pin, depending on whether the signal SG4c is High or Low. That is to say, the fourth pin PN4 functions as an input pin when the signal SG4c is High, and it functions as an output pin when the signal SG4c is Low.

A similar signal direction setting mechanism is provided also for the fifth pin PN5, where information stored in the setting memory STMe is given as a signal SG5c to both of a 3-state buffer TB5 and a transfer gate TG5. While FIG. 12 only shows signal direction setting mechanisms associated with the pins PN4 and PN5, it is understood that similar mechanisms (not shown) are provided also for other pins PN1 to PN3, PN6 to PN8.

FIG. 13 is a diagram illustrating the contents stored in a memory table MTe contained in the setting memory STMe. The memory table MTe stores data about signal input/output directions at the pins PN1 to PN8, as well as other information (not shown) such as control data for an input/output control register (not shown) provided in the semiconductor chip CPa. Such memory table MTe is called SFR (Special Function Register), for example.

For instance, the data ST4 about the signal direction at the fourth pin PN4 includes bit data Sin4 in which a flag is set ON when the fourth pin PN4 should function as an input pin and bit data Sout4 in which a flag is set ON when the fourth pin PN4 should function as an output pin. Similarly, the data ST5 about the signal direction at the fifth pin PN5 includes bit data Sin5 and Sout5.

It is then determined, depending on the states of the flags in the bit data Sin4 and Sout4, whether the signal SG4c given to the 3-state buffer TB4 and the transfer gate TG4 associated with the fourth pin PN4 should be High or Low. That is to say, when the flag in the bit data Sin4 is ON and the flag in the bit data Sout4 is OFF, then the signal SG4c is High and the fourth pin PN4 functions as an input pin. On the other hand, when the flag in the bit data Sin4 is OFF and the flag in the bit data Sout4 is ON, then the signal SG4c is Low and the fourth pin PN4 functions as an output pin.

The same applies to the signal SG5c for the fifth pin PN5, and also to other pins PN1 to PN3 and PN6 to PN8.

Such signal direction setting mechanisms can thus specify whether to make the individual pins PN1 to PN8 serve as input pins or output pins.

When a pin is dead (not connected) and functions as an input pin, then the potential at the dead pin comes in a floating state, so that the signal level, High or Low, cannot be determined. This may cause malfunctions of the core circuitry CR.

Accordingly, in the memory table MTe of FIG. 13, the flags in the bit data Sin4 and Sout4 must be properly set so that the dead pin functions as an output pin. That is, when the dead pin functions as an output pin, then the potential is fixed at the potential of a signal generated in the core circuitry CR (either High or Low). Such potential control for dead pins is generally referred to as "dead pin potential control process."

However, the setting of data in the memory table MTe for specifying the input/output directions of signals at the individual pins PN1 to PN8 is done by the customer to which the semiconductor chip CPa has been delivered. When the fourth pin PN4 and the fifth pin PN5 are used as dead pins in the package PKa shown in FIG. 10, the customer can easily notice that the two pins are dead pins. That is to say, the presence of the external lead terminals LD4 and LD5 allows the customer to readily notice the presence of the fourth and fifth pins PN4 and PN5 within the semiconductor chip CPa.

On the other hand, with the package PKb of FIG. 11, it is difficult for the customer to notice that the fourth pin PN4 and the fifth pin PN5 are dead pins. That is, the customer may fail to notice the presence of the fourth and fifth pins PN4 and PN5 within the semiconductor chip CPa because it has no external lead terminals associated with the fourth and fifth pins PN4 and PN5.

Thus, in the memory table MTe, data about signal input/output directions at individual pins PN1 to PN8 is likely to be set improperly, especially with packages like the package PKb shown in FIG. 11. That is, even when the memory table MTe includes items for setting data about the signal input/output directions at the individual pins, the customer may fail to notice them, or may set data inadequately, since the presence of the fourth pin PN4 and the fifth pin PN5 within the semiconductor chip CPa is not easy to notice for the customer. Then dead pins may function as input pins, possibly causing malfunctions of the core circuitry CR.

SUMMARY OF THE INVENTION

An object of the present invention is to provide a semiconductor chip with which presence of dead pins can be readily noticed and a dead pin potential control process can be performed easily.

According to an aspect of the present invention, a semiconductor chip includes a plurality of pins, core circuitry, and an input/output controller. The plurality of pins serve as input/output terminals for signals, the core circuitry processes or stores the signals, and the input/output controller controls the input/output of the signals through the pins.

At least one of the plurality of pins is a dead pin which is not used. The input/output controller has a storage area for storing settings for controlling the input/output of the signals, and the storage area contains, as one of the settings, a first item for specifying whether a given potential should be applied to the at least one dead pin, and the semiconductor chip further includes a switch capable of applying the given potential to the at least one dead pin in accordance with the content of the first item.

The storage area in the input/output controller stores, as one of the settings, a first item for specifying whether or not to apply a given potential to at least one dead pin and a given potential can be applied to the at least one dead pin in accordance with the content of the first item. This provides a semiconductor chip with which the presence of dead pins can be easily noticed and a dead pin potential control process can be performed easily.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 9:
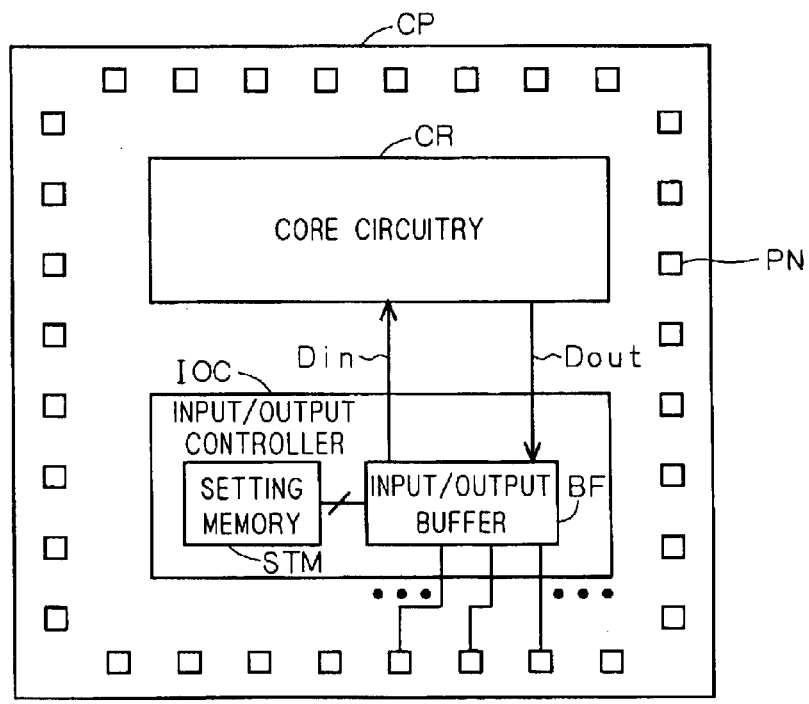
FIG. 9 is a diagram showing the structure of a common semiconductor chip.
Figure 10:
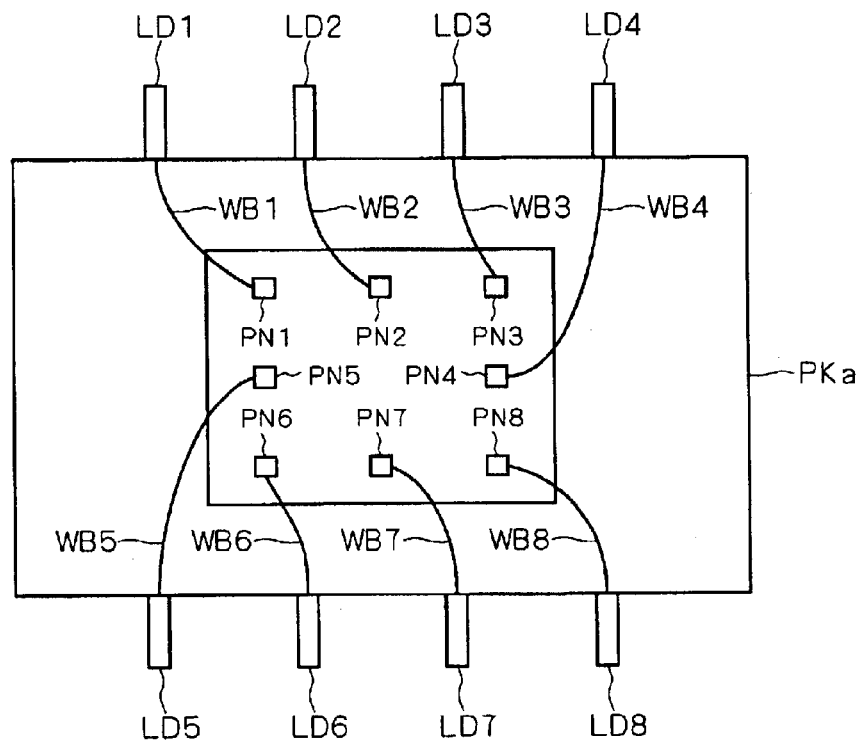
FIG. 10 is a diagram showing a semiconductor chip in which all pins are connected to external lead terminals of the package.
Figure 11:
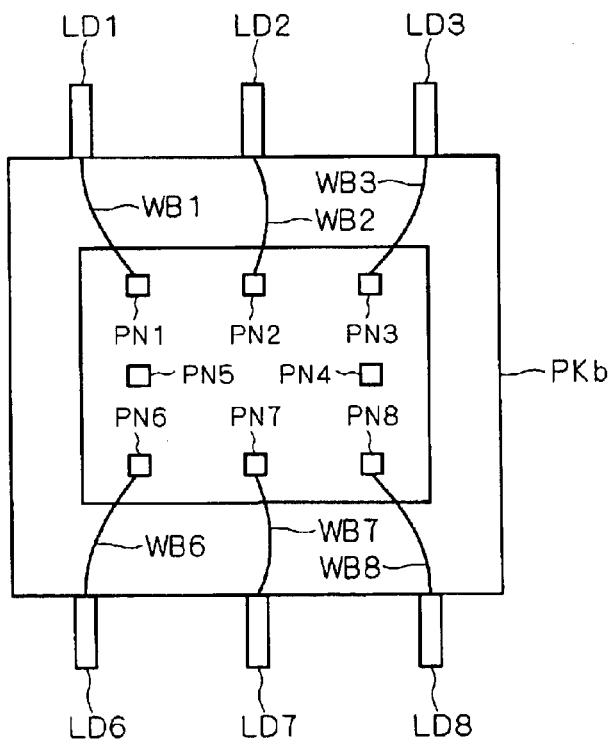
FIG. 11 is a diagram showing a semiconductor chip in which some of the pins are not connected to external lead terminals of the package.

This preferred embodiment provides a semiconductor chip in which a memory table contained in the setting memory STM shown in FIG. 9 includes an item about a dead pin potential control process so that a power-supply potential or a ground potential can be applied collectively to all dead pins (unconnected pins). This semiconductor chip allows dead pins to be noticed easily, thereby facilitating the dead pin potential control process.

Figure 1:
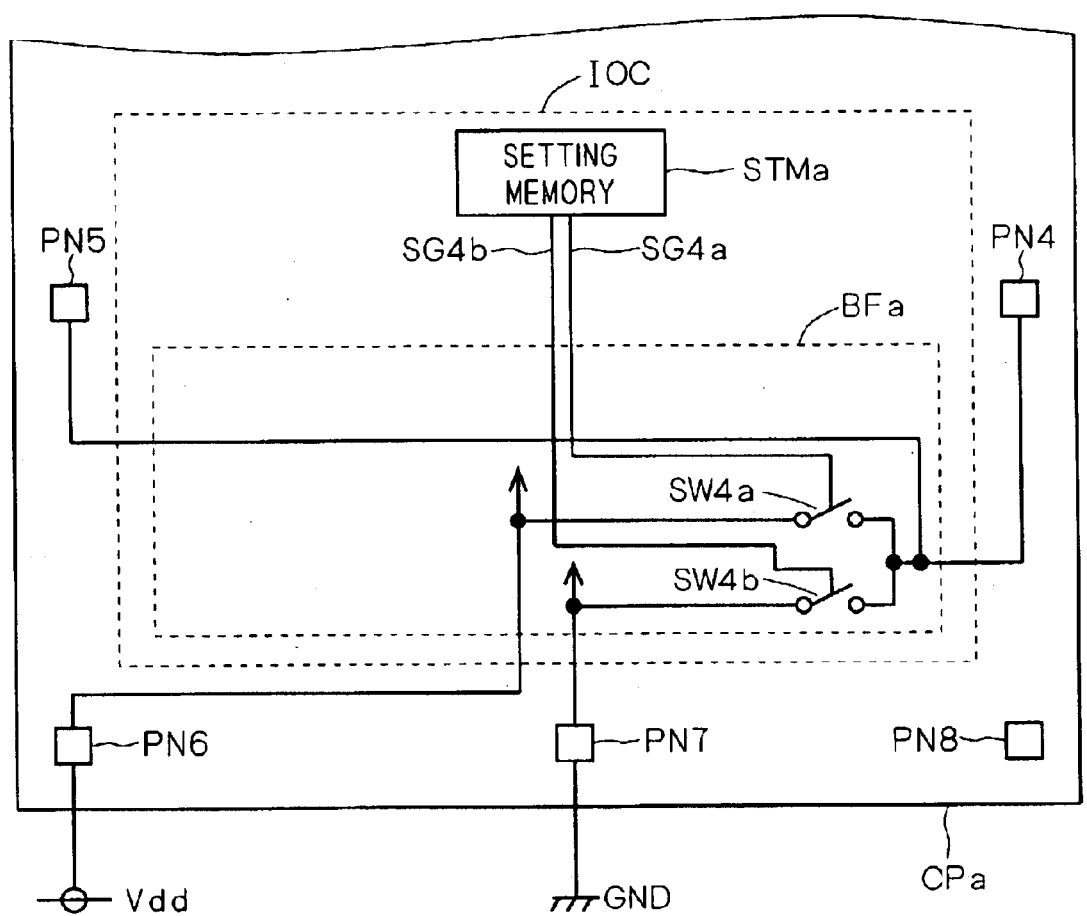
FIG. 1 is a diagram showing a semiconductor chip according to a first preferred embodiment.

FIG. 1 is a diagram showing an example of the structure of the semiconductor chip of this preferred embodiment. Like FIGS. 10 to 12, FIG. 1 shows a simple example where a semiconductor chip CPa has eight pins (PN1 to PN8). It is assumed that the fourth pin PN4 and the fifth pin PN5 are dead pins.

Though not shown in FIG. 1, the semiconductor chip CPa has core circuitry CR, like that shown in FIG. 9, for processing or storing signals. Also, the semiconductor chip CPa includes an input/output controller IOC for coordinating the input/output of signals through the pins PN1 to PN8, and the input/output controller IOC includes an input/output buffer BFa and a setting memory STMa.

Figure 12:
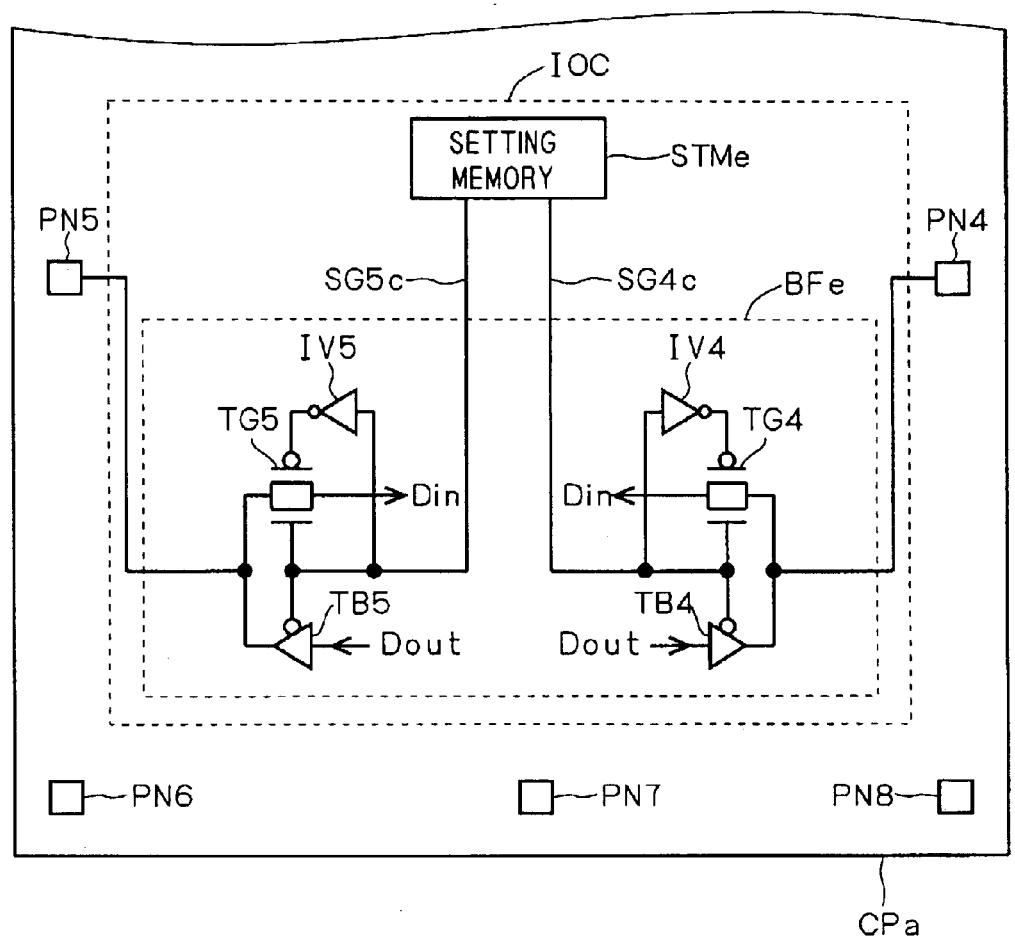
FIG. 12 is a diagram showing signal direction setting mechanisms in an input/output buffer in a conventional semiconductor chip.

The input/output buffer BFa times and coordinates the transfer of signals between the core circuitry CR and the individual pins PN1 to PN8, i.e. an input signal Din to the core circuitry CR and an output signal Dout from the core circuitry CR. Though not shown in FIG. 1, the input/output buffer BFa has signal direction setting mechanisms for individual pins as shown in FIG. 12. The setting memory STMa, formed of a register, is a storage area for storing settings for the signal input/output control in the input/output buffer BFa.

In the semiconductor chip CPa of this preferred embodiment, as shown in FIG. 1, a power-supply potential Vdd is given to the fifth pin PN6 and a ground potential GND is given to the seventh pin PN7, for example. The power-supply potential Vdd provided through the sixth pin PN6 and the ground potential GND provided through the seventh pin PN7 function as internal power-supply potentials for operations in the semiconductor chip CPa. The input/output buffer BFa includes switches SW4a and SW4b which can respectively apply the power-supply potential Vdd and the ground potential GND, serving as in-chip potentials, to both dead pins, or the fourth pin PN4 and the fifth pin PN5.

Figure 2:
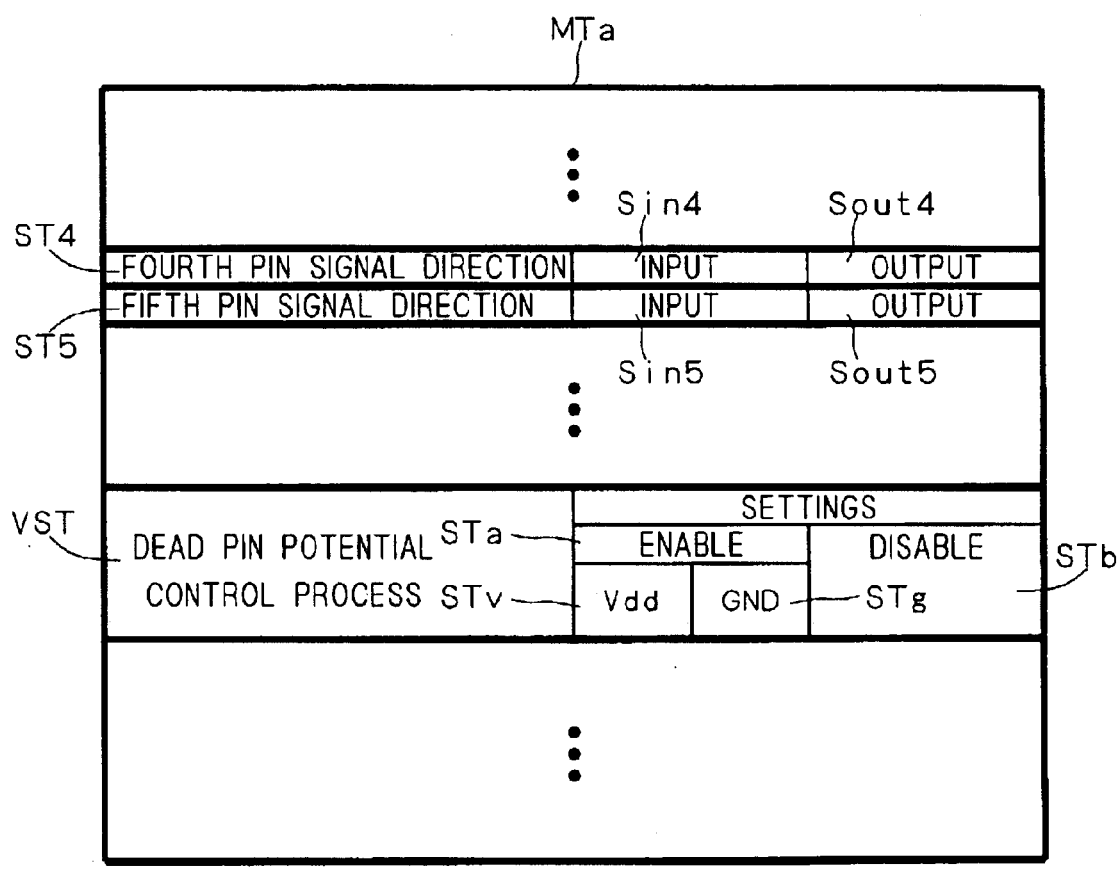
FIG. 2 is a diagram illustrating the contents stored in a memory table in a setting memory of the semiconductor chip of the first preferred embodiment.
Figure 13:
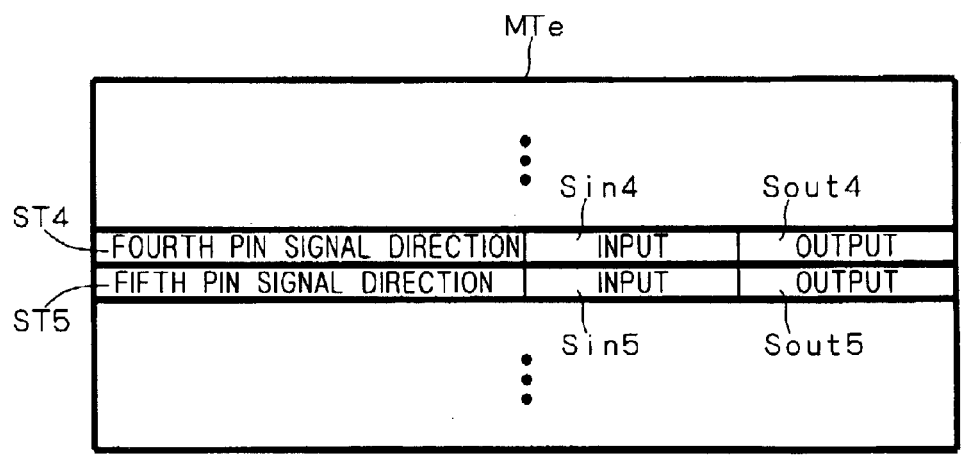
FIG. 13 is a diagram illustrating the contents stored in a memory table in a setting memory of the conventional semiconductor chip.

FIG. 2, like FIG. 13, illustrates the contents stored in the memory table MTa contained in the setting memory STMa. The memory table MTa, like that shown in FIG. 13, stores data ST4 and ST5 about signal directions at the pins. The memory table MTa also includes an item VST about the dead pin potential control process. In this preferred embodiment, the term "dead pin potential control process" means a process of causing dead pins to serve as input pins and applying a given potential to them.

The item VST includes bit data STa in which a flag is set ON when the dead pin potential control process is required and bit data STb in which a flag is set ON when the dead pin potential control process is not required.

The item VST further includes items which are set when the dead pin potential control process is enabled, i.e. bit data STv in which a flag is set ON when the power-supply voltage Vdd should be given to the dead pins and bit data STg in which a flag is set ON when the ground potential GND should be given to the dead pins.

When the dead pin potential control process is done in this preferred embodiment, the signal direction setting mechanisms (not shown in FIG. 1) for all dead pins are set in the input direction. For example, suppose that the flag in the bit data STa is ON and the flag in the bit data STb is OFF. Then, in the data ST4 about the signal direction at the fourth pin PN4, for example, the flag in the bit data Sin4 is forced ON and the flag in the bit data Sout4 is forced OFF. The same settings are made in the data ST5 about the signal direction at the fifth pin PN5.

When the bit data in the item VST has been set and the dead pin potential control process is done, then the signal SG4a or the signal SG4b becomes active to cause the switch SW4a or SW4b to conduct.

That is to say, when the flags are ON in the bit data STa and STv and the flags are OFF in the bit data STb and STg, then the switch SW4b does not conduct but the switch SW4a conducts, so that the power-supply potential Vdd is collectively applied to the dead pins, i.e. the fourth pin PN4 and the fifth pin PN5. On the other hand, when the flags are ON in the bit data STa and STg and the flags are OFF in the bit data STb and STv, then the switch SW4a does not conduct but the switch SW4b conducts, so that the ground potential GND is collectively applied to the dead pins or the fourth pin PN4 and the fifth pin PN5.

According to the semiconductor chip of this preferred embodiment, the setting memory STMa includes the item VST for specifying whether a given potential should be applied to dead pins and the switches SW4a and SW4b can apply the given potential to the dead pins in accordance with the contents of the item VST. Therefore, even when dead pins have no corresponding external lead terminals as in the package PKb shown in FIG. 1, the item VST helps the operator, who makes I/O control for the semiconductor chip CPa, to notice the presence of dead pins, thus providing a semiconductor chip with easy dead pin potential control process.

Moreover, the setting memory STMa includes further items (bit data STg and STv) for specifying which of the ground potential GND and power-supply potential Vdd should be applied to the dead pins. It is thus possible to apply the ground potential GND or power-supply potential Vdd to the dead pins so as to fix the potential at the dead pins.

Furthermore, in the semiconductor chip of this preferred embodiment, the item VST is configured to specify whether to collectively apply a given potential to all dead pins, and the switches SW4a and SW4b are each capable of applying a given potential collectively to all dead pins. Therefore the dead pin potential control process can be easily performed by only setting the single item VST.

<Second Preferred Embodiment>

This preferred embodiment shows a modification of the semiconductor chip of the first preferred embodiment. In the first preferred embodiment, a given potential is collectively provided to the dead pins, i.e. the fourth pin PN4 and the fifth pin PN5. However, in this preferred embodiment, a given potential is separately applied to each of dead pins, or the fourth pin PN4 and the fifth pin PN5.

Figure 3:
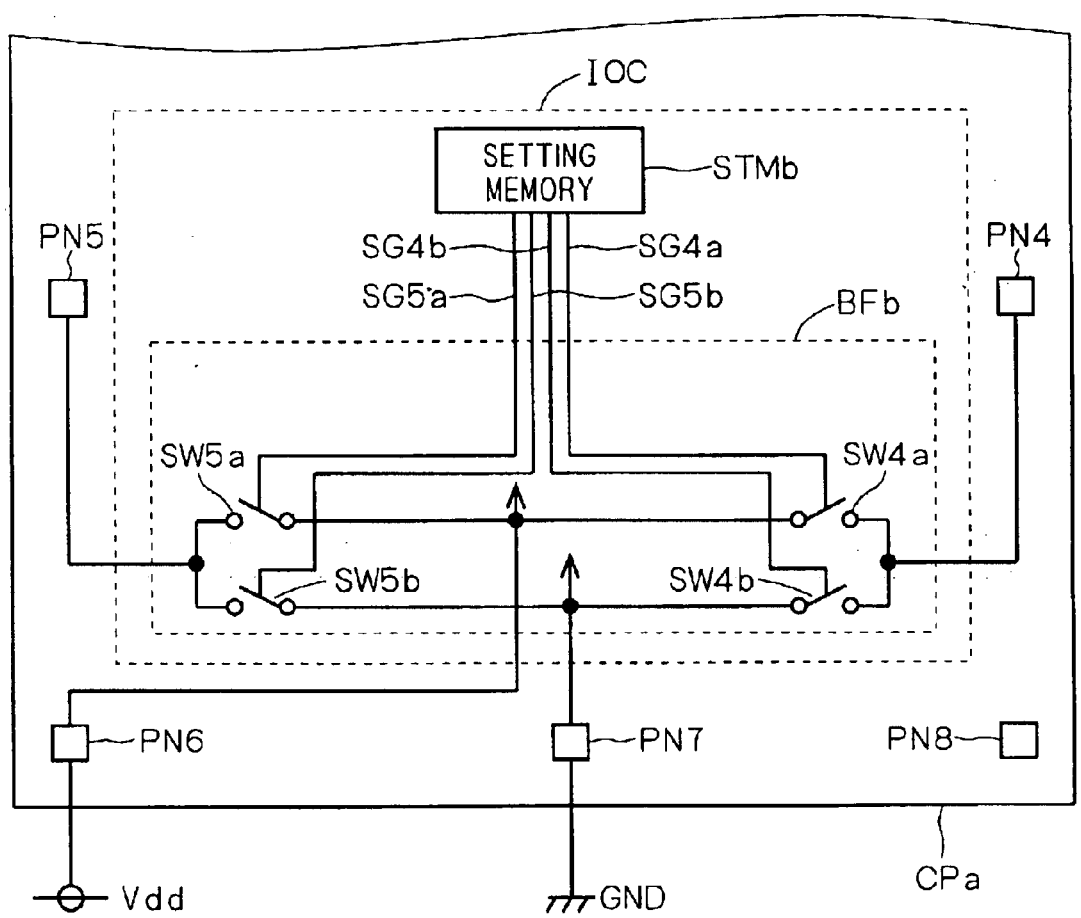
FIG. 3 is a diagram showing a semiconductor chip according to a second preferred embodiment.

FIG. 3 is a diagram showing an example of the structure of the semiconductor chip of this preferred embodiment. In FIG. 3, components having the same functions as those of the semiconductor chip of the first preferred embodiment are shown with the same reference characters. The setting memory is shown as STMb and the input/output buffer is shown as BFb in this preferred embodiment.

In this preferred embodiment, as shown in FIG. 3, the input/output buffer BFb includes switches SW5a and SW5b in addition to the switches SW4a and SW4b. The power-supply potential Vdd and the ground potential GND, serving as in-chip potentials, can be applied to the fourth pin PN4 respectively via the switch SW4a and the switch SW4b, and to the fifth pin PN5 respectively via the switch SW5a and the switch SW5b.

Figure 4:
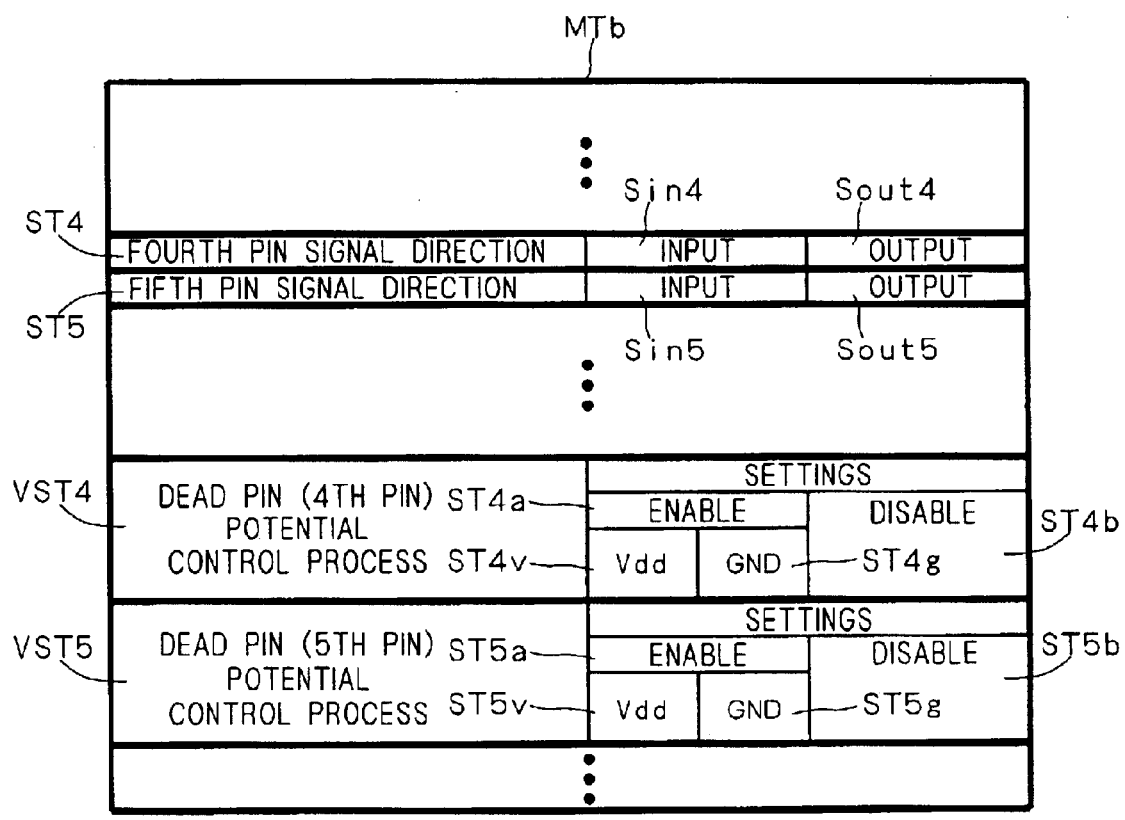
FIG. 4 is a diagram illustrating the contents stored in a memory table in a setting memory of the semiconductor chip of the second preferred embodiment.

FIG. 4, like FIG. 2, illustrates the contents stored in the memory table MTb in the setting memory STMb. The memory table MTb stores data ST4 and ST5, similar to those shown in FIG. 2, for specifying signal directions at respective pins. The memory table MTb includes items VST4 and VST5 about the dead pin potential control process for the dead, fourth pin PN4 and the dead, fifth pin PN5, respectively. In this preferred embodiment, the "dead pin potential control process" means a process of causing a dead pin to function as an input pin and applying a given potential to it.

The items VST4 and VST5 respectively include bit data ST4a and ST5a in which a flag is set ON when the dead pin potential control process is required, and bit data ST4b and ST5b in which a flag is set ON when the dead pin potential control process is not required.

The items VST4 and VST5 further include items that are set when the dead pin potential control process is enabled, i.e. bit data ST4v and ST5v in which a flag is set ON when the power-supply potential Vdd should be given to the dead pin and bit data ST4g and ST5g where a flag is set ON when the ground potential GND should be given to the dead pin.

In this preferred embodiment, when the dead pin potential control process is applied to a dead pin, the signal direction setting mechanism (not shown in FIG. 3) for that dead pin is set in the input direction. For example, suppose that the flag in the bit data ST4a is ON and the flag in the bit data ST4b is OFF. Then, in the data ST4 about the signal direction at the fourth pin PN4, the flag in the bit data Sin4 is forced ON and the flag in the bit data Sout4 is forced OFF. The flags are set in the same way also in the data ST5 about the signal direction at the fifth pin PN5.

When the bit data in the item VST4 has been set and the dead pin potential control process is done, the signal SG4a or SG4b becomes active to cause the switch SW4a or SW4b to conduct.

That is to say, when the flags are ON in the bit data ST4a and ST4v and the flags are OFF in the bit data ST4b and ST4g, then the switch SW4b does not conduct but the switch SW4a conducts, so that the power-supply potential Vdd is applied to the dead, fourth pin PN4. On the other hand, when the flags are ON in the bit data ST4a and ST4g and the flags are OFF in the bit data ST4b and ST4v, then the switch SW4a does not conduct but the switch SW4b conducts, so that the ground potential GND is applied to the dead, fourth pin PN4.

When the bit data in the item VST5 has been set and the dead pin potential control process is done, the signal SG5a or SG5b becomes active to cause the switch SW5a or SW5b to conduct.

That is to say, when the flags are ON in the bit data ST5a and ST5v and the flags are OFF in the bit data ST5b and ST5g, then the switch SW5b does not conduct but the switch SW5a conducts, so that the power-supply potential Vdd is applied to the dead, fifth pin PN5. On the other hand, when the flags are ON in the bit data ST5a and ST5g and the flags are OFF in the bit data ST5b and ST5v, then the switch SW5a does not conduct but the switch SW5b conducts, so that the ground potential GND is applied to the dead, fifth pin PN5.

According to the semiconductor chip of this preferred embodiment, items about the dead pin potential control process are provided respectively in correspondence with individual dead pins and the switches are also provided in correspondence with dead pins. This allows the dead pin potential control process to be individually applied to each dead pin.

Moreover, in the setting memory STMb, items (bit data ST4g, ST4v, ST5g, ST5v) for specifying which of the ground potential GND and the power-supply potential Vdd should be applied to dead pins are provided also in correspondence with individual dead pins. It is then possible to apply the ground potential GND or the power-supply potential Vdd to each dead pin so as to fix the potential.

<Third Preferred Embodiment>

This preferred embodiment, too, is a modification of the semiconductor chip of the first preferred embodiment. In the semiconductor chip of the first preferred embodiment, dead pins are made to function as input pins and supplied with the power-supply potential Vdd or ground potential GND. However, in this preferred embodiment, dead pins can be made to function also as output pins.

Figure 5:
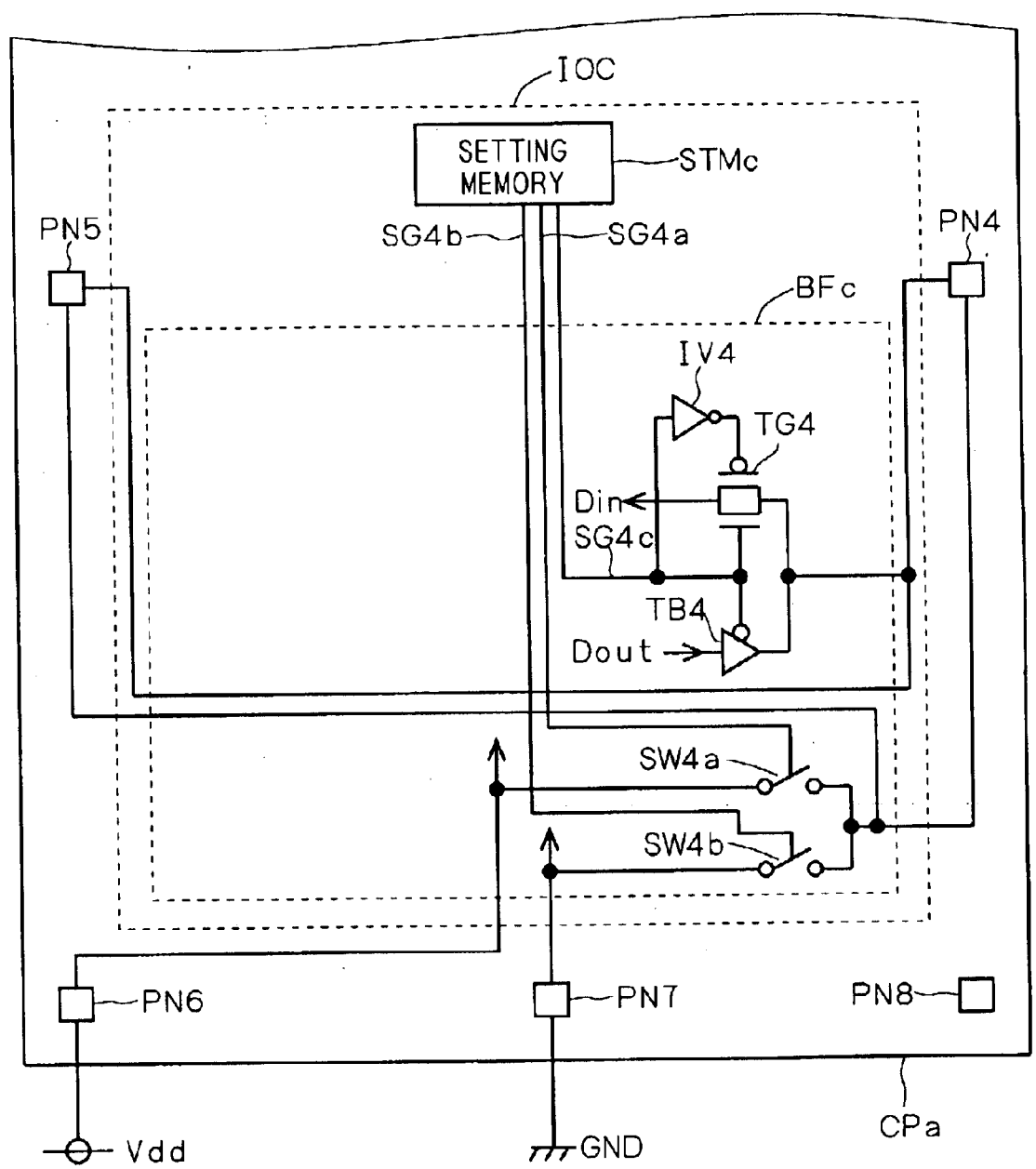
FIG. 5 is a diagram showing a semiconductor chip according to a third preferred embodiment.

FIG. 5 is a diagram that shows an example of the structure of the semiconductor chip of this preferred embodiment. In FIG. 5, components having the same functions as those in the semiconductor chip of the first preferred embodiment are shown with the same reference characters. The setting memory is shown as STMc and the input/output buffer is shown as BFc in this preferred embodiment.

Among the signal direction setting mechanisms shown in FIG. 12, FIG. 5 of the semiconductor chip of this preferred embodiment shows a signal direction setting mechanism associated with the dead pins PN4 and PN5. That is to say, the input/output buffer BFc includes a signal direction setting mechanism having the 3-state buffer TB4 and transfer gate. TG4. A single set of signal direction setting mechanism is enough since a given potential is collectively applied to all dead pins in the first preferred embodiment.

The 3-state buffer TB4 receives at its input end the output signal Dout from the core circuitry CR, and its output end is connected to the fourth pin PN4 and the fifth pin PN5. Information stored in the setting memory STMc is given as a signal SG4c, e.g. logically inverted, to the enable end of the 3-state buffer TB4.

The transfer gate TG4 has its input end connected to the fourth and fifth pins PN4 and PN5, and its output end outputs the input signal Din to the core circuitry CR. The signal SG4c is applied to the gate of the N-channel MOS transistor of the transfer gate TG4, and also to the gate of the P-channel MOS transistor of the transfer gate TG4 through the inverter IV4.

The signal SG4c is given to both of the 3-state buffer TB4 and the transfer gate TG4 as shown above, and it is thus possible to determine whether to make the fourth pin PN4 and the fifth pin PN5 function as input pins or output pins, depending on whether the signal SG4c is High or Low. That is to say, the fourth and fifth pins PN4 and PN5 function as input pins when the signal SG4c is High, and they function as output pins when the signal SG4c is Low.

Figure 6:
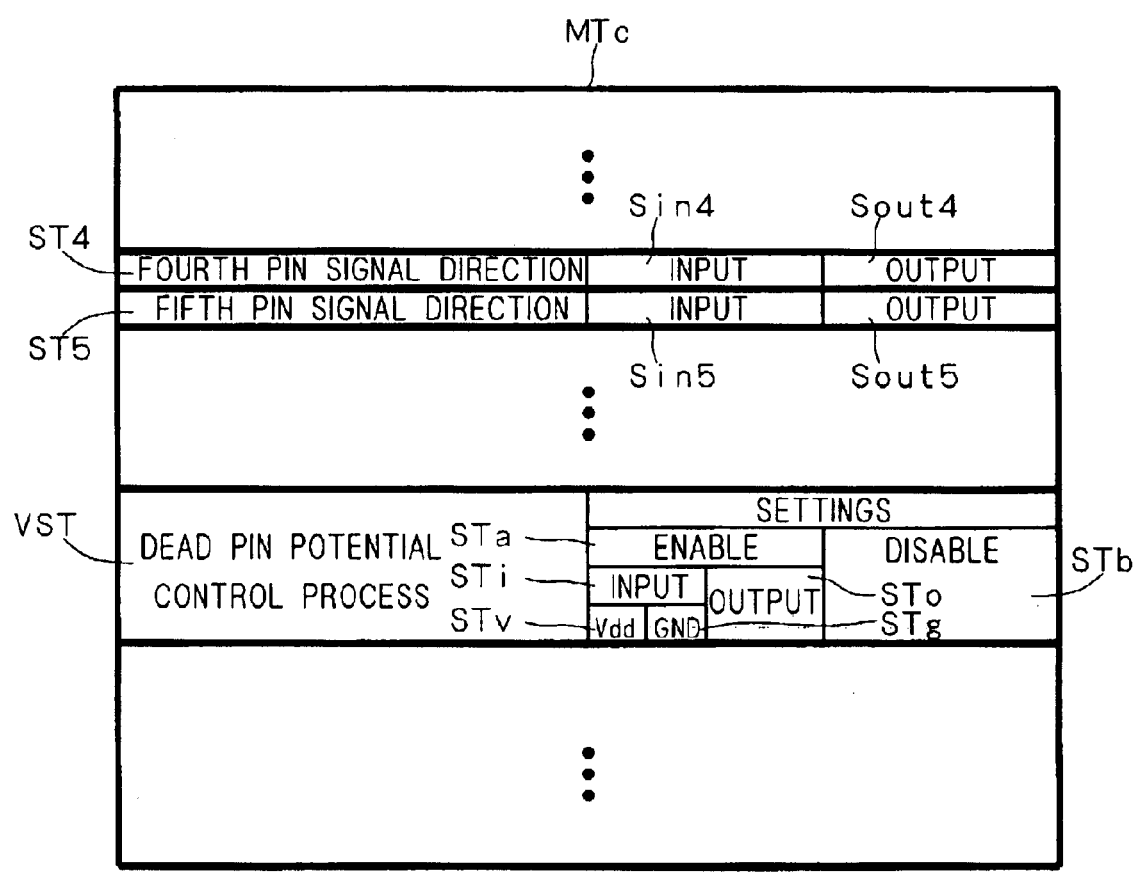
FIG. 6 is a diagram illustrating the contents stored in a memory table in a setting memory of the semiconductor chip of the third preferred embodiment.

FIG. 6, like FIG. 2, illustrates the contents stored in the memory table MTc contained in the setting memory STMc. The memory table MTc, like that shown in FIG. 2, stores data ST4 and ST5 about signal directions at individual pins and an item VST about the dead pin potential control process. In this preferred embodiment, the term "dead pin potential control process" means a process of making dead pins function as input pins and applying a given potential to them, or of making dead pins function as output pins and applying a potential generated in the core circuitry.

The item VST includes bit data STa in which a flag is set ON when the dead pin potential control process is required, and bit data STb in which a flag is set ON when the dead pin potential control process is not required.

The item VST further includes items that are set when the dead pin potential control process is enabled, i.e. bit data STi in which a flag is set ON when the dead pins should function as input pins and bit data STo in which a flag is set ON when the dead pins should function as output pins. Moreover, the item VST includes still further items that are set when the dead pins are made to function as input pins, i.e. bit data STv in which a flag is set ON when the power-supply potential Vdd should be given to the dead pins and bit data STg in which a flag is set ON when the ground potential GND should be given to the dead pins.

In this preferred embodiment, when the dead pin potential control process is done to cause dead pins to function as output pins, the signal direction setting mechanism of FIG. 5 is set in the output direction. For example, suppose that the flags in the bit data STa and STo are ON and the flags in the bit data STb and STi are OFF. Then, in the data ST4 about the signal direction at the fourth pin PN4, the flag in the bit data Sout4 is forced ON and the flag in the bit data Sin4 is forced OFF. The flags are set ON/OFF in the same way in the data ST5 about the signal direction at the fifth pin PN5. Then the signal SG4c is Low and the fourth and fifth pins PN4 and PN5 function as output pins.

On the other hand, when the dead pin potential control process is done to cause the dead pins to function as input pins, the signal direction setting mechanism of FIG. 5 is set in the input direction. For example, suppose that the flags in the bit data STa and STi are ON and the flags in the bit data STb and STo are OFF. Then, in the data ST4 about the signal direction at the fourth pin PN4, the flag in the bit data Sin4 is forced ON and the flag in the bit data Sout4 is forced OFF. The flags are set ON/OFF in the same way in the data ST5 about the signal direction at the fifth pin PN5. Then the signal SG4c is High and the fourth and fifth pins PN4 and PN5 function as input pins.

According to the semiconductor chip of this preferred embodiment, the setting memory STMc includes items (bit data STi and STo) for specifying whether to make dead pins function as input pins or output pins. It is then possible to apply the signal Dout from the core circuitry CR to dead pins to fix the potential, as well as to apply a given potential to dead pins.

<Fourth Preferred Embodiment>

This preferred embodiment shows a combination of the second and third preferred embodiments. With this semiconductor chip, it is possible to separately apply a given potential to each of the dead pins, i.e. the fourth pin PN4 and the fifth pin PN5, and also to make each dead pin function as an output pin.

Figure 7:
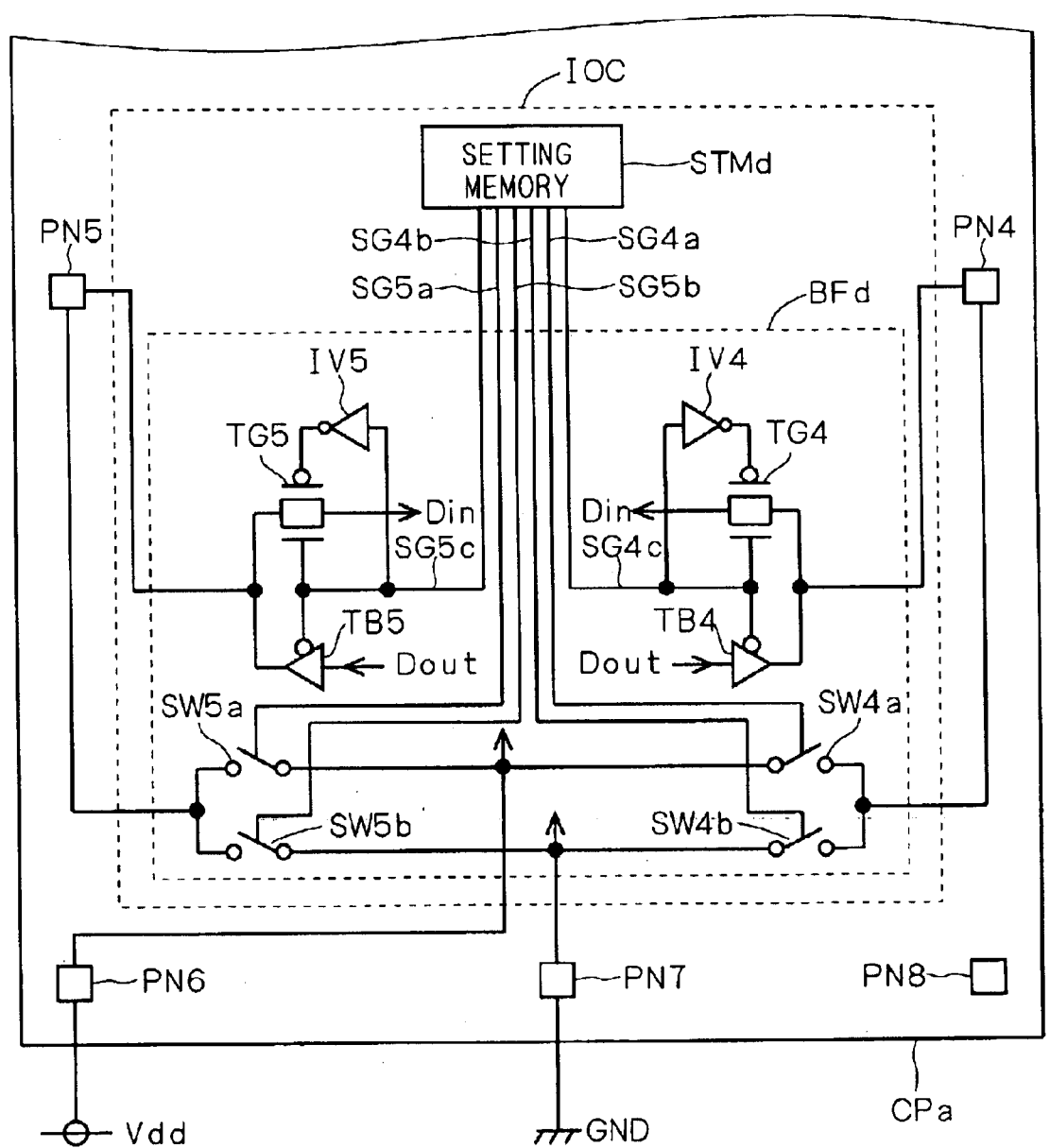
FIG. 7 is a diagram showing a semiconductor chip according to a fourth preferred embodiment.

FIG. 7 is a diagram that shows an example of the structure of the semiconductor chip of this preferred embodiment. In FIG. 7, components having the same functions as those of the semiconductor chip of the second preferred embodiment are shown with the same reference characters. The setting memory is shown as STMd and the input/output buffer is shown as BFd in this preferred embodiment.

FIG. 7 of the semiconductor chip of this preferred embodiment shows the signal direction setting mechanisms for individual dead pins shown in FIG. 12. That is to say, the input/output buffer BFd includes the signal direction setting mechanism having the 3-state buffer TB4 and transfer gate TG4 and the signal direction setting mechanism having the 3-state buffer TB5 and transfer gate TG5. A signal direction setting mechanism must be provided for each dead pin, since a given potential is separately applied to each of dead pins in the second preferred embodiment.

The 3-state buffer TB4 receives at its input end the output signal Dout from the core circuitry CR and its output end is connected to the fourth pin PN4. Information stored in the setting memory STMd is given as the signal SG4c, e.g. logically inverted, to the enable end of the 3-state buffer TB4.

The transfer gate TG4 has its input end connected to the fourth pin PN4, and its output end outputs the input signal Din to the core circuitry CR. The signal SG4c is applied to the gate of the N-channel MOS transistor of the transfer gate TG4 and also to the gate of the P-channel MOS transistor of the transfer gate TG4 through the inverter IV4.

The signal SG4c is applied to both of the 3-state buffer TB4 and the transfer gate TG4 as shown above, and it is then possible to determine whether to make the fourth pin PN4 function as an input pin or an output pin, depending on whether the signal SG4c is High or Low. That is to say, the fourth pin PN4 functions as an input pin when the signal SG4c is High, and it functions as an output pin when the signal SG4c is Low.

The 3-state buffer TB5 receives at its input end the output signal Dout from the core circuitry CR and its output end is connected to the fifth pin PN5. Information stored in the setting memory STMd is given as the signal SG5c, e.g. logically inverted, to the enable end of the 3-state buffer TB5.

The transfer gate TG5 has its input end connected to the fifth pin PN5, and its output end outputs the input signal Din to the core circuitry CR. The signal SG5c is applied to the gate of the N-channel MOS transistor of the transfer gate TG5 and also to the gate of the P-channel MOS transistor of the transfer gate TG5 through the inverter IV5.

The signal SG5c is applied to both of the 3-state buffer TB5 and the transfer gate TG5 as shown above, and it is then possible to determine whether to make the fifth pin PN5 function as an input pin or an output pin, depending on whether the signal SG5c is High or Low. That is to say, the fifth pin PN5 functions as an input pin when the signal SG5c is High, and it functions as an output pin when the signal SG5c is Low.

Figure 8:
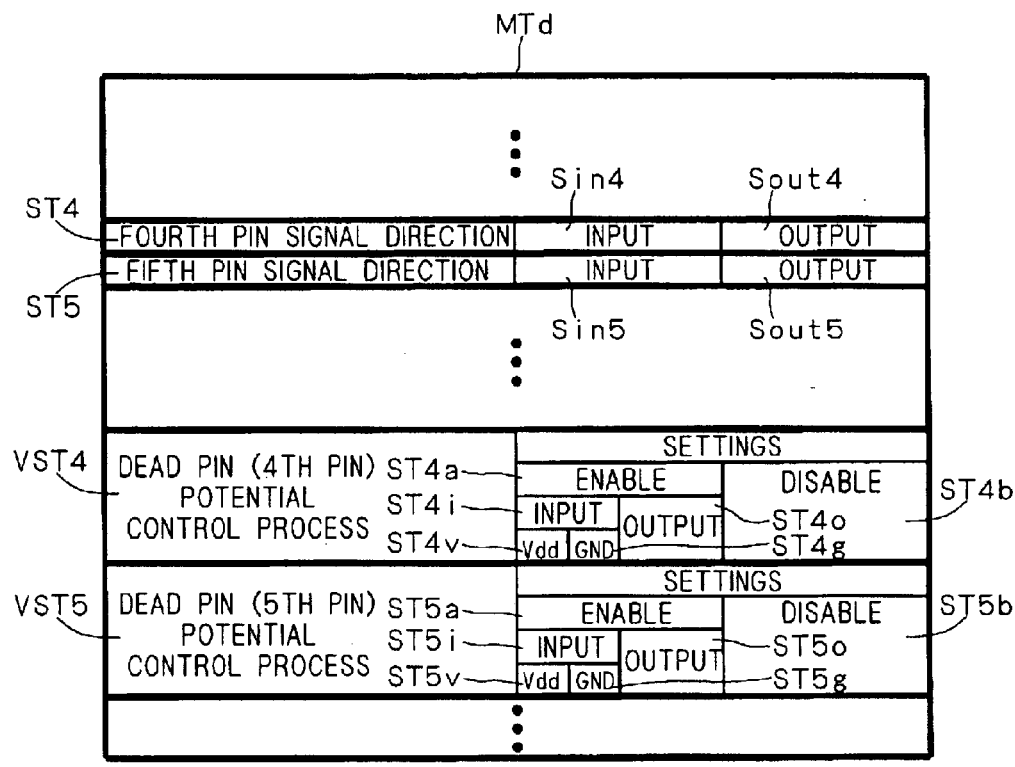
FIG. 8 is a diagram illustrating the contents stored in a memory table in a setting memory of the semiconductor chip of the fourth preferred embodiment.

FIG. 8, like FIG. 4, illustrates the contents stored in the memory table MTd contained in the setting memory STMd. Like that shown in FIG. 4, the memory table MTd stores data ST4 and ST5 about signal directions at individual pins and items VST4 and VST5 about the dead pin potential control process. In this preferred embodiment, the term "dead pin potential control process" means a process of making a dead pin function as an input pin and applying a given potential to it, or a process of making a dead pin function as an output pin and applying a potential generated in the core circuitry.

The items VST4 and VST5 respectively include bit data ST4a and ST5a in which a flag is set ON when the dead pin potential control process is required, and bit data ST4b and ST5b in which a flag is set ON when the dead pin potential control process is not required.

The items VST4 and VST5 further include items that are set when the dead pin potential control process is enabled, i.e. bit data ST4i and ST5i in which a flag is set ON when the dead pin should function as an input pin and bit data ST4o and ST5o in which a flag is set ON when the dead pin should function as an output pin. Moreover, the items VST4 and VST5 include still further items that are set when the dead pin is made to function as an input pin, i.e. bit data ST4v and ST5v in which a flag is set ON when the power-supply potential Vdd should be given to the dead pin and bit data ST4g and ST5g in which a flag is set ON when the ground potential GND should be given to the dead pin.

In this preferred embodiment, when the dead pin potential control process is done to cause a dead pin to function as an output pin, the signal direction setting mechanism of FIG. 7 is set in the output direction. For example, suppose that the flags in the bit data ST4a and ST4o are ON and the flags in the bit data ST4b and ST4i are OFF. Then, in the data ST4 about the signal direction at the fourth pin PN4, the flag in the bit data Sout4 is forced ON and the flag in the bit data Sin4 is forced OFF. Then the signal SG4c is Low and the fourth pin PN4 functions as an output pin.

When the flags in the bit data ST5a and ST5o are ON and the flags in the bit data ST5b and ST5i are OFF, then, in the data ST5 about the signal direction at the fifth pin PN5, the flag in the bit data Sout5 is forced ON and the flag in the bit data Sin5 is forced OFF. Then the signal SG5c is Low and the fifth pin PN5 functions as an output pin.

On the other hand, when the dead pin potential control process is done to cause a dead pin to function as an input pin, the signal direction setting mechanism of FIG. 7 is set in the input direction. That is to say, when the flags in the bit data ST4a and ST4i are ON and the flags in the bit data ST4b and ST4o are OFF, then, in the data ST4 about the signal direction at the fourth pin PN4, the flag in the bit data Sin4 is forced ON and the flag in the bit data Sout4 is forced OFF. Then the signal SG4c is High and the fourth pin PN4 functions as an input pin.

When the flags in the bit data ST5a and ST5i are ON and the flags in the bit data ST5b and ST5o are OFF, then, in the data ST5 about the signal direction at the fifth pin PN5, the flag in the bit data Sin5 is forced ON and the flag in the bit data Sout5 is forced OFF. Then the signal SG5c is High and the fifth pin PN5 functions as an input pin.

According to the semiconductor chip of this preferred embodiment, items about the dead pin potential control process are provided in correspondence with individual dead pins and switches are also provided in correspondence with individual pins. Therefore the dead pin potential control process can be performed independently for each dead pin. Moreover, the setting memory STMd contains items (bit data ST4i, ST5i, ST4o, ST5o) for specifying whether to make a dead pin function as an input pin or an output pin. Therefore it is also possible to apply the output signal Dout from the core circuitry CR to a dead pin to fix the potential, as well as to apply a given potential to it.

While the invention has been described in detail, the foregoing description is in all aspects illustrative and not restrictive. It is understood that numerous other modifications and variations can be devised without departing from the scope of the invention.

What is claimed is:

1. A semiconductor chip comprising:

a plurality of pins serving as input/output terminals for signals;

core circuitry for processing or storing said signals; and an input/output controller for controlling input/output of said signals through said pins;

wherein at least one of said plurality of pins is a dead pin which is not used, said input/output controller has a storage area for storing settings for controlling the input/output of said signals, said storage area contains, as one of said settings, a first item for specifying whether a given potential should be applied to said at least one dead pin, and said semiconductor chip further comprises a switch capable of applying said given potential to said at least one dead pin in accordance with the content of said first item.

2. The semiconductor chip according to claim 1, wherein said given potential is either a ground potential or a power-supply potential, said storage area further contains, as another one of said settings, a second item for specifying which of said ground potential and said power-supply potential should be applied to said at least one dead pin, and said switch is capable of applying said ground potential or said power-supply potential in accordance with the content of said second item.

3. The semiconductor chip according to claim 1, wherein said at least one dead pin comprises a plurality of dead pins, and said first item specifies whether or not to collectively apply said given potential to all of said plurality of dead pins and said switch is capable of collectively applying said given potential to all of said plurality of dead pins.

4. The semiconductor chip according to claim 1, wherein said at least one dead pin comprises a plurality of dead pins, and said first item comprises a plurality of first items in correspondence with said plurality of dead pins and said switch comprises a plurality of switches in correspondence with said plurality of dead pins.

5. The semiconductor chip according to claim 4, wherein said given potential is either a ground potential or a power-supply potential, said storage area further contains, as another one of said settings, a plurality of second items provided in correspondence with said plurality of dead pins, each for specifying which of said ground potential and said power-supply potential should be applied to a corresponding one of said plurality of dead pins, and said plurality of switches are each capable of applying said ground potential or said power-supply potential in accordance with the content of a corresponding one of said plurality of second items.

6. The semiconductor chip according to claim 1, wherein said storage area further contains, as still another one of said settings, a third item for specifying whether said at least one dead pin should be made to function as an input pin for receiving an input signal from the outside or as an output pin for extracting an output signal to the outside, and wherein when said at least one dead pin is made to function as said output pin in accordance with the content of said third item, one of said signals that is outputted from said core circuitry is applied to said at least one dead pin, and when said at least one dead pin is made to function as said input pin in accordance with the content of said third item, said given potential is applied to said at least one dead pin via said switch in accordance with the content of said first item.

* * * * *